(12) United States Patent
Pentlehner et al.

(10) Patent No.: US 11,374,207 B2
(45) Date of Patent: *Jun. 28, 2022

(54) OPTOELECTRONIC ASSEMBLY AND METHOD FOR PRODUCING AN OPTOELECTRONIC ASSEMBLY

(71) Applicant: Pictiva Displays International Limited, Dublin (IE)

(72) Inventors: Dominik Pentlehner, Burghausen (DE); Richard Baisl, Regensburg (DE)

(73) Assignee: Pictiva Displays International Limited, Dublin (IE)

( * ) Notice: Subject to any disclaimer, the term of this patent is extended or adjusted under 35 U.S.C. 154(b) by 0 days.

This patent is subject to a terminal disclaimer.

(21) Appl. No.: 17/120,524

(22) Filed: Dec. 14, 2020

(65) Prior Publication Data

US 2021/0167318 A1    Jun. 3, 2021

Related U.S. Application Data

(63) Continuation of application No. 16/070,534, filed as application No. PCT/EP2017/051993 on Jan. 31, 2017, now Pat. No. 10,903,458.

(30) Foreign Application Priority Data

Feb. 2, 2016 (DE) .................... 10 2016 101 788.4

(51) Int. Cl.
*H01L 51/52* (2006.01)

(52) U.S. Cl.
CPC ........ *H01L 51/529* (2013.01); *H01L 51/5237* (2013.01)

(58) Field of Classification Search
CPC .......................... H01L 51/529; H01L 51/5237
See application file for complete search history.

(56) References Cited

U.S. PATENT DOCUMENTS

| 10,903,458 | B2 * | 1/2021 | Pentlehner | H01L 51/529 |
| 2006/0132031 | A1 * | 6/2006 | Chang | H01L 51/529 313/512 |
| 2012/0091923 | A1 * | 4/2012 | Kastner-Jung | F21S 10/02 315/360 |

(Continued)

FOREIGN PATENT DOCUMENTS

| DE | 102012109161 A1 | 5/2014 |
| DE | 102013111409 A1 | 4/2015 |

(Continued)

OTHER PUBLICATIONS

Aaswath et al.; "Passive radiative cooling ambient air temperature under direct sunlight"; Nature; Nov. 27, 2014; 11 pages; vol. 515.

(Continued)

*Primary Examiner* — Allen L Parker
*Assistant Examiner* — Wasiul Haider
(74) *Attorney, Agent, or Firm* — Botos Churchill IP Law LLP

(57) ABSTRACT

An optoelectronic assembly comprising an optoelectronic component, which comprises a specularly reflective surface and comprising a radiation cooler in direct physical contact with the optoelectronic component. The radiation cooler is arranged above the specularly reflective surface.

20 Claims, 6 Drawing Sheets

(56) References Cited

U.S. PATENT DOCUMENTS

| | | | |
|---|---|---|---|
| 2012/0132950 A1* | 5/2012 | Yamamuro | H01L 51/529 |
| | | | 257/99 |
| 2015/0236294 A1 | 8/2015 | Schicktanz et al. | |
| 2015/0333286 A1* | 11/2015 | Yan | H01L 51/529 |
| | | | 313/46 |
| 2015/0338175 A1* | 11/2015 | Raman | F28F 13/18 |
| | | | 165/185 |
| 2016/0020261 A1 | 1/2016 | Kim | |
| 2016/0181565 A1* | 6/2016 | Lee | H01L 51/524 |
| | | | 438/26 |
| 2016/0233398 A1 | 8/2016 | Farrnbacher et al. | |
| 2016/0276630 A1 | 9/2016 | Farrnbacher et al. | |
| 2017/0047539 A1 | 2/2017 | Pentlehner et al. | |

FOREIGN PATENT DOCUMENTS

| | | |
|---|---|---|
| DE | 102013111422 A1 | 4/2015 |
| DE | 102014106069 A1 | 11/2015 |
| EP | 2485566 A1 | 8/2012 |
| JP | 2010146894 A | 7/2010 |

OTHER PUBLICATIONS

German Search Report based on application No. 10 2016 101 788.4 dated Nov. 8, 2016 (10 pages) (for reference purpose only).
International Search Report based on appplication No. PCT/EP2017/051993 dated Apr. 11, 2017 (4 pages and 2 pages english translation). (for reference purpose only).
Zhu et al.; "Radiative cooling for solar cells"; Proceedings of Spie; ISSN; Mar. 16, 2015; 8 pages; vol. 9358.

* cited by examiner

OPTOELECTRONIC ASSEMBLY AND METHOD FOR PRODUCING AN OPTOELECTRONIC ASSEMBLY

CROSS-REFERENCE TO RELATED APPLICATIONS

The present application is a continuation of U.S. patent application Ser. No. 16/070,534, filed Jul. 17, 2018, allowed, which application is a national stage entry according to 35 U.S.C. § 371 of PCT application No.: PCT/EP2017/051993 filed on Jan. 31, 2017, which claims priority from German Patent Application Serial No.: 10 2016 101 788.4 which was filed Feb. 2, 2016, and is incorporated herein by reference in its entirety and for all purposes.

TECHNICAL FIELD

The disclosure relates to an optoelectronic assembly and to a method for producing an optoelectronic assembly.

SUMMARY OF THE INVENTION

An optoelectronic assembly may include one, two or more optoelectronic components. An optoelectronic component may be an electromagnetic radiation emitting component or an electromagnetic radiation absorbing component. An electromagnetic radiation absorbing component may be a solar cell, as a non-limiting example. An electromagnetic radiation emitting component may be, as a non-limiting example, a light emitting diode, a light emitting transistor, an organic light emitting diode or an organic light emitting transistor. Optoelectronic components on an organic basis, so-called organic optoelectronic components, are finding increasingly widespread application. By way of a non-limiting embodiment, organic light emitting diodes (OLEDs) are increasingly making inroads in general lighting, as a non-limiting example, as surface light sources, and in automotive applications, as a non-limiting example, as rear lights, brake lights, flashing indicators or interior lighting.

An organic optoelectronic component, as a non-limiting example, an OLED, may include an anode and a cathode and an organic functional layer system therebetween. The organic functional layer system may include one or more emitter layers in which electromagnetic radiation is generated, a charge generating layer structure including in each case two or more charge generating layers (CGLs) for charge generation, and one or more electron blocking layers, also referred to as hole transport layers (HTLs), and one or more hole blocking layers, also referred to as electron transport layers (ETLs), in order to direct the current flow.

The operating lifetime of OLEDs is generally temperature-dependent and, in the range of room temperature to approximately 85° C., decreases approximately by a factor of two to three per 25 K temperature increase. The exact dependence is dependent on many properties, such as the exact layer construction, as a non-limiting example. Above approximately 100° C. the aging is additionally accelerated, and at temperatures of above approximately 120° C. to 130° C. a spontaneous irreversible failure may even be observed within minutes.

In this case, aging as a result of the operation of an OLED at a constant current density is manifested by a rise in voltage and a fall in luminance. Aging as a result of storage, during which the OLED is not operated, is manifested primarily by a rise in voltage. A fall in luminance may also occur here, but is generally of secondary importance.

The crucial temperature for the aging of the OLED both during operation and during storage is the temperature of the OLED which is composed additively of the ambient temperature basically present and the inherent heating that occurs during operation. For estimating the inherent heating it is possible to establish a balance:

$$P\_ges = P\_heat - P\_cool;$$

where P_ges is the thermal power that leads to a temperature change, P_heat is the heat input of the OLED itself, and P_cool is the power that is dissipated by various cooling mechanisms, wherein the following holds true:

$$P\_heat = j*U*A(1-WPE);$$

where j is the current density, U is the voltage, A is the luminous area and WPE is the wall plug efficiency of the OLED.

The operating lifetime of the OLED at a predefined ambient temperature may be increased by optimizing the organic layer stack and the encapsulation. Furthermore, attempts are made to minimize the source term P_heat by means of particularly efficient OLEDs. This may have the effect that the OLED is constructed in a particularly complex fashion and/or is producible with a particularly high outlay.

Besides these endeavors, which concern the OLED itself, the OLED may also be actively cooled. That is to say that the term P_cool may be actively increased, as a non-limiting example, by means of a Peltier element, by means of forced convection, as a non-limiting example, by means of a fan, or by means of cooling with a cooling liquid, as a non-limiting example, by means of water cooling. This may have the effect that the optoelectronic assembly including the corresponding illuminant and the corresponding cooling element is formed in a particularly large and/or complex fashion and/or that the optoelectronic assembly is producible with a particularly high outlay.

Even if the OLED is not actively cooled, nevertheless the term P_cool is not equal to zero, since the OLED, like any other body, permanently emits thermal radiation, an equilibrium with the ambient temperature being established here.

Radiation coolers have recently become known from the technical field of building cooling. A radiation cooler of this type has the property that it emits more heat via thermal radiation than it takes up via thermal radiation, with the result that a temperature that is less than the ambient temperature is established in the radiation cooler.

FIG. 1 shows a building cooler 100. The building cooler 100 includes a frame 102, including at the top side thereof a cutout, which is covered by a membrane 104 and below which a trough 106 is arranged. The membrane 104 is formed by low density polyethylene. An upper surface of the frame 102 that is not covered by the membrane 104 is covered with aluminized Mylar. The trough 106 includes a cutout, in which a plastics body 108 is arranged, at the top side of which a conventional radiation cooler 110 is arranged. The trough 106 includes clear acrylic. The frame 102 is formed by wood. The plastics body 108 includes polystyrene. The trough 106, the plastics body 108 and the membrane 104 enclose a closed air pocket. An outer surface of the plastics body 108 that is not covered by the conventional radiation cooler 110 is coated with aluminized Mylar.

The building cooler 100 is arranged on a roof (not illustrated) of a building (not illustrated) and is thermally connected to a cooling system (not illustrated) extending in the building. The building cooler 100 shown is optimized toward minimizing cooling by thermal conduction and convection, in order that the cooling effect is substantially restricted to radiative cooling. The building cooler 100 is arranged such that the sunlight impinges on the surface at right angles.

FIG. 2 shows a detailed sectional illustration of the conventional radiation cooler 110. The conventional radiation cooler 110 includes a base body 112 formed by silicon, an adhesion layer 113 formed on the base body 112 and formed by titanium, a mirror layer 114 formed on the adhesion layer 113 and formed by silver, and a cooling layer structure formed on the mirror layer 114. The cooling layer structure includes a plurality of layers stacked one above another. The layers are formed alternately by silicon dioxide and hafnium oxide. The different layers have different refractive indices and different thicknesses. In this case, the cooling layer structure includes at least a first thickness region 116, in which the individual layers have thicknesses of between 100 nm and 1000 nm, and a second thickness region 118, in which the individual layers have thicknesses of between 10 and 100 nm. The second thickness region 118 is formed above the mirror layer 114 and the first thickness region 116 is formed above the second thickness region 118. The adhesion layer 113 may optionally be dispensed with.

The layers are optimized toward reflecting sunlight and at the same time maximizing the emissivity in the range of 8 μm to 13 μm. To that end, the "Needle Optimization Technique" may be used, with the boundary conditions of a layer sequence of SiO2 (low refractive index) and HfO2 (high refractive index). The cooling principle is based on a combination of material properties, such as, as a non-limiting example, the emissivity, and interference effects.

A thorough illustration of the conventional radiation cooler 110, the functioning thereof and the physical principles may be found in the letter or technical article "Passive radiative cooling below ambient air temperature under direct sunlight", by Aaswath P. Raman et al., printed on page 540 et seq., of the physical journal Nature, Volume 515, from Nov. 27, 2014.

The diagrams shown in FIGS. 4 to 6 were plotted with the building cooler 100 shown in FIG. 1 and with the conventional radiation cooler 110 explained with reference to FIG. 2.

FIG. 3 shows an absorption spectrum 82 of the conventional radiation cooler 110 as a solid line and an emission spectrum 80 of the sun as an area in a first diagram, in which the emission/absorption EM/AB normalized to one is represented as a function of the wavelength LAM of the electromagnetic radiation. The first diagram reveals that the conventional radiation cooler 110 absorbs only extremely little electromagnetic radiation in the significant range of the solar spectrum, which means that even under direct insolation the conventional radiation cooler 110 heats up only relatively little compared with a conventional body, as a non-limiting example, an aluminum body or a black body.

FIG. 4 shows an emission spectrum 86 of the radiation cooler 110 as a solid line and a transmissivity 84 of the atmosphere as an area in a second diagram, in which the emission/absorption EM/AB normalized to one is represented as a function of the wavelength LAM of the electromagnetic radiation. The second diagram reveals that the conventional radiation cooler 110 emits electromagnetic radiation substantially in a wavelength range in which the atmosphere is largely transmissive.

The properties—illustrated by the first and second diagrams—of the conventional radiation cooler 110 and in particular the cooling layer structure thereof in interaction with the mirror layer 114 have the effect that even under direct insolation the temperature of the conventional radiation cooler 110 is fundamentally lower than the ambient temperature. In particular, the conventional radiation cooler 110 may decrease to a temperature that is lower than the ambient temperature by 5° C.

FIG. 5 shows a third diagram, in which the temperature T is plotted on the left-hand Y-axis and the irradiance SI of the sun is plotted on the right-hand Y-axis, both variables being represented as a function of the time of day TIME in the third diagram. In the third diagram, the topmost almost straight and arcuate line shows the emitted solar energy 90, which attains a maximum approximately at midday. The ambient temperature 92 is plotted directly underneath, which rises during the course of the day from 10° C. to approximately 17.5° C. after 14:00. The bottommost line shows the temperature 94 of the conventional radiation cooler 110, which rises from approximately 7.5° C. at around 10:00 in the morning to a maximum of approximately 12.5° between 13:00 and 14:00. It may be seen here that the temperature 94 of the conventional radiation cooler 110 is always significantly below the ambient temperature 92, in particular up to 5° below the ambient temperature 92.

FIG. 6 shows a fourth diagram, in which the same dependencies as in the third diagram are represented with regard to the variables, wherein the topmost line again represents the irradiance 90, the line underneath represents a temperature 96 of black color exposed to solar radiation, the line illustrated underneath represents the temperature 98 of an aluminum body exposed to the sun, the line underneath represents the ambient temperature 92 and the bottommost line represents the temperature 94 of the conventional radiation cooler 110 exposed to solar radiation. With regard to heating in direct sunlight, a conventional OLED corresponds approximately to an aluminum body. The fourth diagram reveals that under direct insolation black color heats up to a greater extent than aluminum, that aluminum heats up to a greater extent than the ambient temperature 92, and that the temperature 94 of the conventional radiation cooler 110 remains below the temperature 98 of aluminum, or of a conventional OLED, and below the temperature 96 of black color and even below the ambient temperature 92.

A non-limiting object of the description is to provide an optoelectronic assembly which is constructed in a simple manner, which is compact and/or has a particularly long lifetime.

A non-limiting object of the disclosure is to provide a method for producing an optoelectronic assembly which is implementable in a simple manner and/or which contributes to the optoelectronic assembly being compact and/or having a particularly long lifetime.

A non-limiting object is achieved in accordance with one aspect of the disclosure by means of an optoelectronic assembly, including an optoelectronic component, which includes a specularly reflective surface, and including a radiation cooler, which is in direct physical contact with the optoelectronic component and which is arranged above the specularly reflective surface.

The radiation cooler has the effect that the optoelectronic component is cooled both during operation and in a state in which it is not in operation, as a non-limiting example, during storage. On account of this cooling, the average temperature of the optoelectronic component is reduced over its lifetime compared with an optoelectronic component which is not coupled to a radiation cooler, as a result of which the lifetime increases. Consequently, the optoelectronic assembly has a particularly long lifetime. Moreover, the radiation cooler may be formed in the form of a layer structure in or on the optoelectronic component particularly compactly compared with a fan or a water cooling system. Furthermore, the radiation cooler includes no moving parts, for which reason the optoelectronic assembly overall may be constructed and/or may be formed in a particularly simple manner.

The direct physical contact between the radiation cooler and the optoelectronic component has the effect that heat that the optoelectronic component takes up from the surroundings or generates during operation may be transported away effectively to the radiation cooler and the optoelectronic component may thus be cooled. To put it clearly, the cooling of the optoelectronic component, as a non-limiting example, of an OLED, is improved by the amplification of the passive cooling naturally present by optimized radiative cooling by comparison with an optoelectronic assembly without a radiation cooler. Through the use of a layer stack optimized toward that, as a non-limiting example, the cooling power P_cool mentioned in the introduction is significantly increased by comparison with a conventional OLED.

The improvement in the passive cooling of the OLED brings about an increase in the operating lifetime and the storage stability of the OLED for a given ambient temperature and/or a reduction of the rise in voltage for a predefined time and ambient temperature, which leads to a lower thermal power of the OLED (P_heat) at a predefined time, and/or an increase in the temperature use range of the OLED toward higher ambient temperatures.

The radiation cooler is thus arranged above the specularly reflective surface and the optoelectronic component is formed such that electromagnetic radiation incident on the radiation cooler from outside penetrates through said radiation cooler and impinges on the specularly reflective surface and is reflected by the latter, such that the electromagnetic radiation is emitted from the specularly reflective surface back through the radiation cooler toward the outside. The radiation cooler may be the conventional radiation body described in the introduction and illustrated in the letter or technical article "Passive radiative cooling below ambient air temperature under direct sunlight", by Aaswath P. Raman et al., printed on page 540 et seq., in the physical journal Nature, Volume 515, from Nov. 27, 2014, or may be formed at least identically or similarly thereto. In particular, the radiation body may include the same cooling layer structure as the conventional radiation cooler.

In accordance with one development, the radiation cooler is arranged on the exterior of the optoelectronic component. This makes it possible to form the optoelectronic component and the radiation cooler independently of one another. Alternatively or additionally, this makes it possible that the radiation cooler may be secured to the optoelectronic component in a simple manner.

In accordance with one development, the optoelectronic component includes a covering body, which closes off the optoelectronic component toward the outside, wherein the radiation cooler is arranged on the covering body. Alternatively or additionally, the optoelectronic component includes a carrier, which closes off the optoelectronic component toward the outside, wherein the radiation cooler or a further radiation cooler is arranged on the carrier. Alternatively or additionally, the optoelectronic component includes a heat sink, which closes off the optoelectronic component toward the outside, wherein the radiation cooler or a further radiation cooler is arranged on the heat sink. This contributes to the fact that the optoelectronic component may be produced in a conventional manner and the radiation cooler may be secured on the exterior of the covering body, the carrier and/or the heat sink in a simple manner. As an alternative thereto, the radiation cooler may firstly be secured to the covering body, the carrier and/or the heat sink or even be formed thereon and may then subsequently be secured together with the covering body, the carrier and/or the heat sink on the rest of the optoelectronic component. In the case of an OLED, this makes it possible that in the course of forming the radiation cooler it is not necessary to take account of the temperature sensitivity of the organic functional layer structure of the optoelectronic component.

In accordance with one development, the radiation cooler is integrated into a layer structure of the optoelectronic component. This may contribute to the optoelectronic assembly being constructed in a particularly simple manner. Alternatively or additionally, this may make it possible for the radiation cooler to perform other tasks and/or functions in the optoelectronic component in addition to cooling, such as, as a non-limiting example, an increase in the coupling-out of light and/or, in the case of an OLED, an encapsulation of the organic functional layer structure.

In accordance with one development, the radiation cooler is in direct physical contact with an electrode of the optoelectronic component. If the corresponding electrode forms an outer surface of the optoelectronic component, then the radiation cooler may be arranged on the exterior of the optoelectronic component, in particular of the corresponding electrode. If the corresponding electrode forms an inner layer of the optoelectronic component, then the radiation cooler may be integrated in the optoelectronic component in such a way that it is in direct physical contact with the corresponding electrode. The direct physical contact with the electrode may contribute to a particularly good heat transfer from the corresponding electrode to the radiation cooler and thus to a particularly efficient cooling of the optoelectronic assembly.

In accordance with one development, the cover glass, the carrier, the heat sink and/or the electrode include(s) or form(s) the specularly reflective surface. In this context, it may be particularly advantageous for the radiation cooler to be arranged on the cover glass, the carrier, the heat sink and/or the electrode including or forming the specularly reflective surface.

In accordance with one development, the radiation cooler is formed as an encapsulation of the optoelectronic component. In particular, the layers of the radiation cooler may be formed in such a way that, in the case of an OLED, they encapsulate the organic functional layer structure of the OLED and/or electrodes of the OLED. As a result, in addition to the function of cooling, the radiation cooler acquires a further function, namely that of the encapsulation of the optoelectronic component. This has the effect that an encapsulation structure provided exclusively for the encapsulation may be dispensed with, the encapsulation effect of the encapsulation structure provided exclusively for the encapsulation may be reduced and/or the encapsulation effect may be intensified overall. This may contribute to the optoelectronic component being producible in a particularly simple and/or compact manner. The radiation cooler may be formed, as a non-limiting example, in the form of a thin film encapsulation.

In accordance with one development, the optoelectronic component is an organic optoelectronic component, as a non-limiting example, a solar cell or OLED. In interaction with the organic optoelectronic component, the radiation cooler may contribute particularly effectively to significantly lengthening the lifetime of the corresponding organic optoelectronic component.

In accordance with one development, the radiation cooler includes a layer structure including a plurality of different layers, wherein the layers have different refractive indices and at least partly different layer thicknesses, wherein in a first thickness region of the layer structure layers are formed which have thicknesses which are greater than the thicknesses of layers in a second thickness region. The layers having the different refractive indices and the different thickness regions have the effect that the radiation cooler cools down relative to the ambient temperature even under direct insolation.

In accordance with one development, the thicknesses in the first thickness region are in a range of 100 to 1000 nm and/or the thicknesses in the second thickness region are in a range of 1 to 100 nm.

In accordance with one development, the layers in part include or are formed by silicon dioxide and in part include or are formed by hafnium oxide or titanium dioxide.

A non-limiting object is achieved in accordance with one aspect of the disclosure by means of a method for producing an optoelectronic assembly, wherein the optoelectronic component, which includes the specularly reflective surface, is coupled to the radiation cooler in such a way that the latter is in direct physical contact with the optoelectronic component and is arranged above the specularly reflective surface.

The advantages and developments of the optoelectronic assembly as presented above may readily be applied to the method for producing the optoelectronic assembly. Therefore, at this juncture, a renewed presentation of the corresponding advantages and developments is dispensed with and reference is made to the above passages of text.

In accordance with one development, firstly the cover glass, the carrier or the heat sink of the optoelectronic component is coupled to the radiation cooler and then the cover glass, the carrier or the heat sink, respectively, with the radiation cooler is coupled to the rest of the optoelectronic component. In order to couple the radiation cooler to the cover glass, the carrier or the heat sink, the completed radiation cooler may be simply arranged and secured on the cover glass, the carrier or the heat sink or the layers of the radiation cooler may be formed on the cover glass, the carrier or the heat sink. In other words, the cover glass, the carrier or the heat sink may serve as a substrate for forming the cooling layer structure of the radiation cooler.

A non-limiting object is achieved in accordance with one aspect of the disclosure by means of a use of the radiation cooler for cooling the optoelectronic component.

The advantages and developments of the optoelectronic assembly as presented above may readily be applied to the use of the radiation cooler for cooling the optoelectronic component. Therefore, at this juncture, a renewed presentation of the corresponding advantages and developments is dispensed with and reference is made to the above passages of text.

In accordance with one development, the optoelectronic component is an OLED. The radiation cooler may be used, as a non-limiting example, as an encapsulation layer or encapsulation structure of the OLED.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the disclosed embodiments. In the following description, various embodiments described with reference to the following drawings in which.

DETAILED DESCRIPTION

Figure 1:
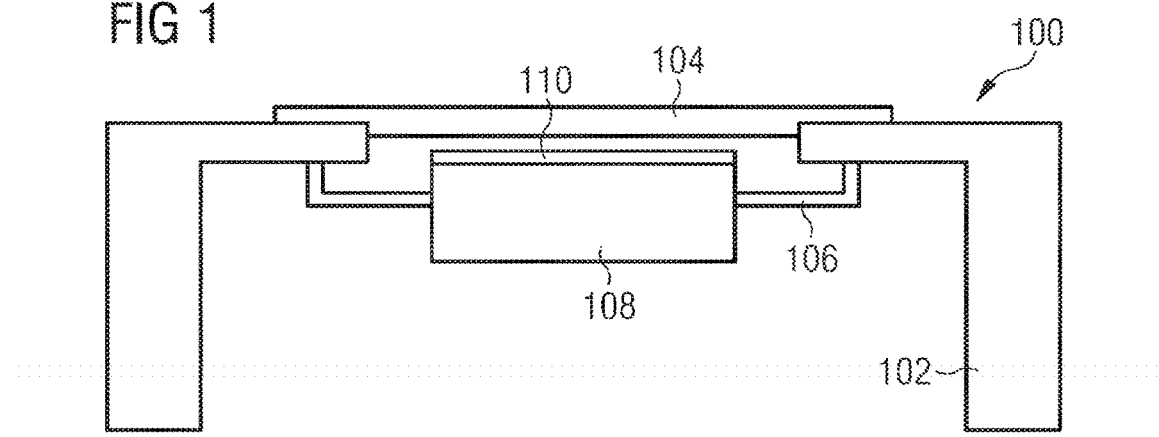
FIG. 1 shows a sectional illustration of a building cooler.

In the following detailed description, reference is made to the accompanying drawings, which form part of this description and show for illustration purposes specific embodiments in which the invention may be implemented. Since component parts of embodiments may be positioned in a number of different orientations, the direction terminology serves for illustration and is not restrictive in any way whatsoever. It goes without saying that other embodiments may be used and structural or logical changes may be made, without departing from the scope of protection of the present disclosure. It goes without saying that the features of the various embodiments described herein may be combined with one another, unless specifically indicated otherwise. Therefore, the following detailed description should not be interpreted in a restrictive sense, and the scope of protection of the present disclosure is defined by the appended claims. In the figures, identical or similar elements are provided with identical reference signs, insofar as this is expedient.

An optoelectronic assembly includes one, two or more optoelectronic components and a radiation cooler. Optionally, an optoelectronic assembly may also include one, two or more electronic components. An electronic component may include, as a non-limiting example, an active and/or a passive component. An active electronic component may include, as a non-limiting example, a computing, control and/or regulating unit and/or a transistor. A passive electronic component may include, as a non-limiting example, a capacitor, a resistor, a diode or a coil.

An optoelectronic component may be an electromagnetic radiation emitting component or an electromagnetic radiation absorbing component. An electromagnetic radiation absorbing component may be a solar cell, as a non-limiting example. In various embodiments, an electromagnetic radiation emitting component may be an electromagnetic radiation emitting semiconductor component and/or can be formed as an electromagnetic radiation emitting diode, as an organic electromagnetic radiation emitting diode, as an electromagnetic radiation emitting transistor or as an organic electromagnetic radiation emitting transistor. The radiation can be, as a non-limiting example, light in the visible range, UV light and/or infrared light. In this context, the electromagnetic radiation emitting component may be formed, as a non-limiting example, as a light emitting diode (LED), as an organic light emitting diode (OLED), as a light emitting transistor or as an organic light emitting transistor. In various embodiments, the light emitting component may be part of an integrated circuit. Furthermore, a plurality of light emitting components may be provided, as a non-limiting example, in a manner accommodated in a common housing.

A radiation cooler has the property that it intrinsically cools down under the ambient temperature. A radiation cooler of this type has an absorption spectrum and an emission spectrum for electromagnetic radiation which are set in relation to one another such that the radiation cooler emits more energy in the form of electromagnetic radiation than it absorbs. Therefore, the radiation cooler basically assumes a temperature that is below the ambient temperature, in particular without an additional cooling system, as a non-limiting example, without a gas, for example air, or liquid, for example water, cooling system.

FIG. 1 shows a building cooler 100 as described in the introduction.

Figure 2:
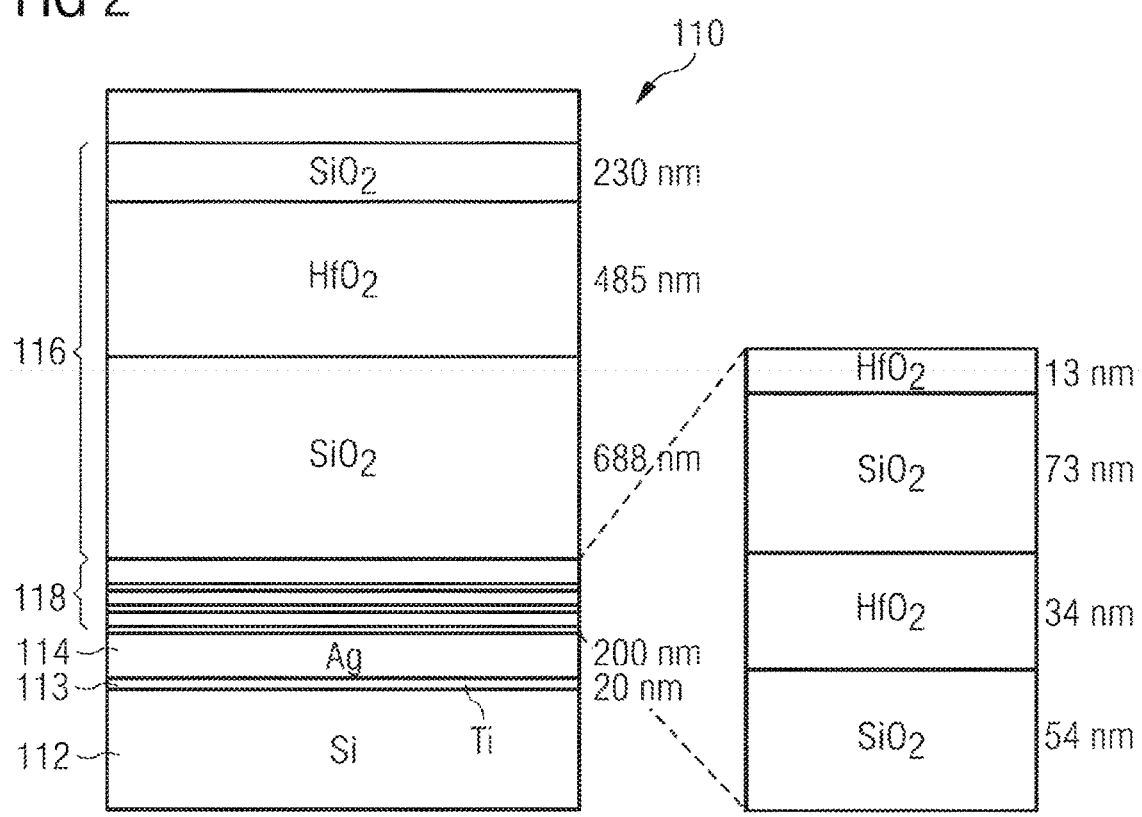
FIG. 2 shows a detailed sectional illustration of a conventional radiation cooler.

FIG. 2 shows a conventional radiation cooler 110 as described in the introduction.

Figure 3:
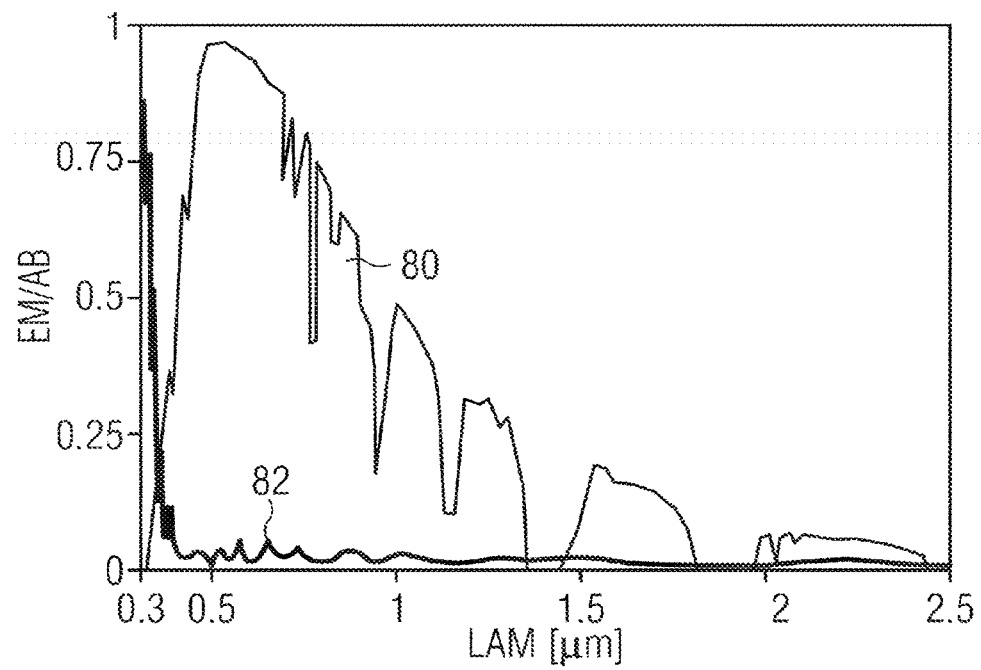
FIG. 3 shows a first diagram.

FIG. 3 shows a first diagram as described in the introduction.

Figure 4:
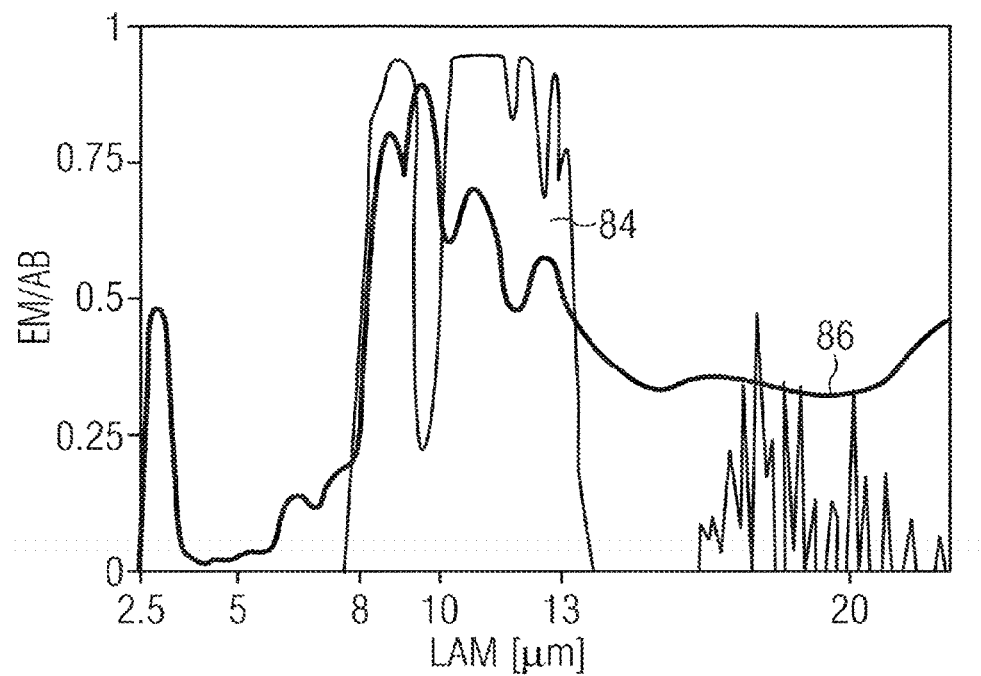
FIG. 4 shows a second diagram.

FIG. 4 shows a second diagram as described in the introduction.

Figure 5:
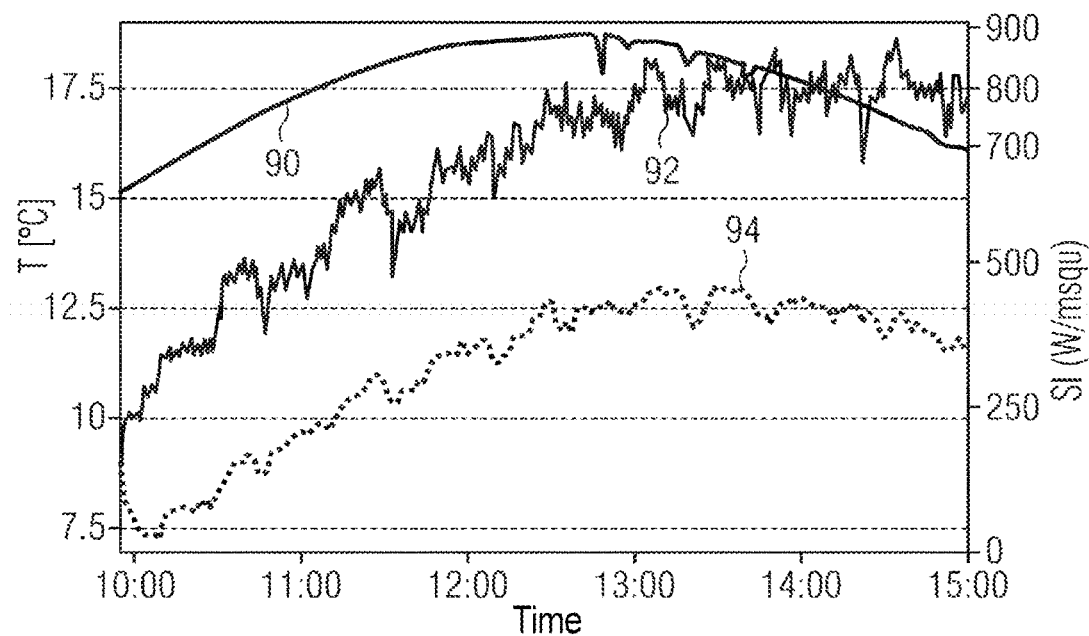
FIG. 5 shows a third diagram.

FIG. 5 shows a third diagram as described in the introduction.

Figure 6:
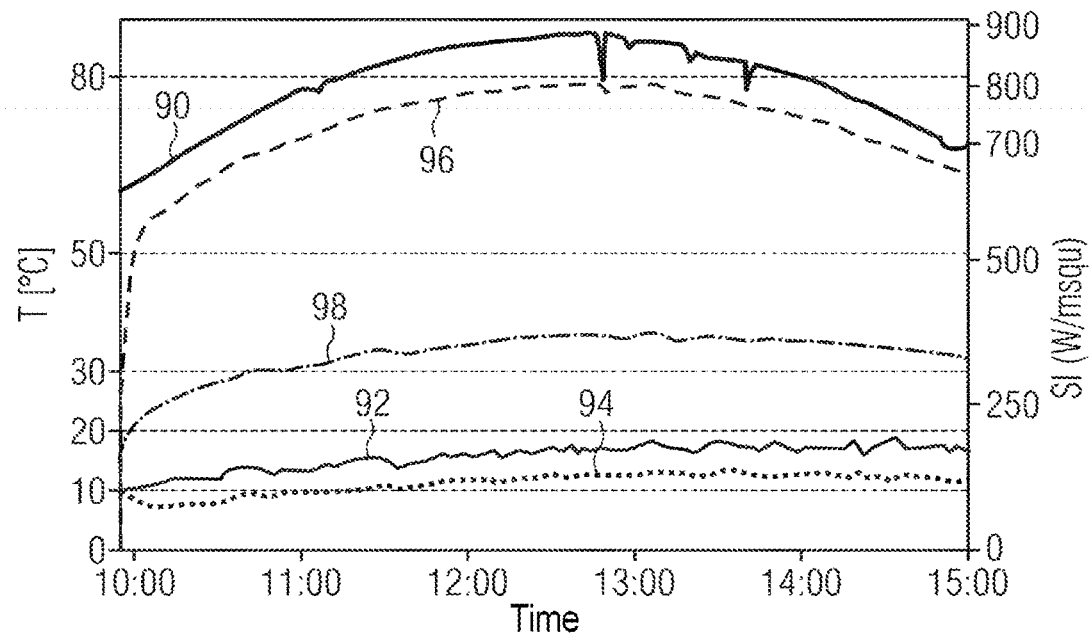
FIG. 6 shows a fourth diagram.

FIG. 6 shows a fourth diagram as described in the introduction.

Figure 7:
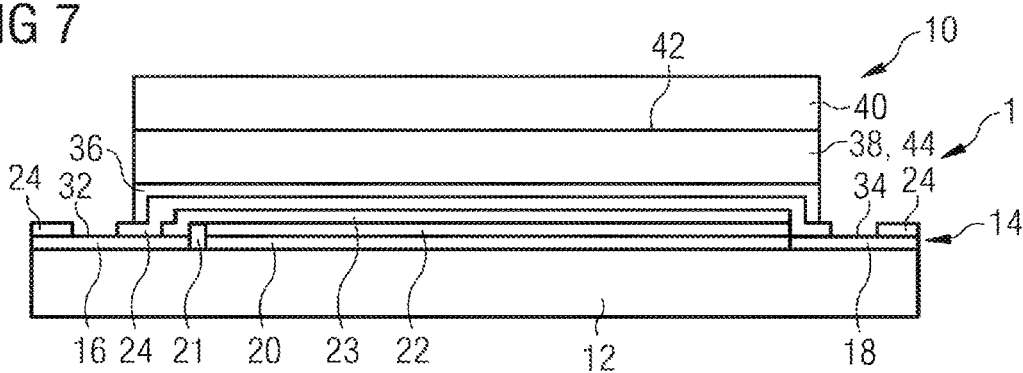
FIG. 7 shows a lateral sectional illustration of one embodiment of an optoelectronic assembly.

FIG. 7 shows one embodiment of an optoelectronic assembly 1. The optoelectronic assembly 1 includes an optoelectronic component 10 and a radiation cooler 40. The radiation cooler 40 is in direct physical contact with the optoelectronic component 10.

The radiation cooler 40 may be the conventional radiation body 110 described above and illustrated in the letter "Passive radiative cooling below ambient air temperature under direct sunlight", by Aaswath P. Raman et al., printed on page 540 et seq., of the physical journal Nature, Volume 515, from Nov. 27, 2014, or may be formed at least identically or similarly thereto. In particular, the radiation body 40 may include the same cooling layer structure as the conventional radiation cooler 110.

The optoelectronic component 10 is preferably formed as a bottom emitter. As an alternative thereto, however, the optoelectronic component 10 may also be formed as a top emitter or as a component that emits on both sides.

The optoelectronic component 10 includes a carrier 12. The carrier 12 may be formed as translucent or transparent. The carrier 12 serves as a carrier element for electronic elements or layers, as a non-limiting example, light emitting elements. The carrier 12 may include or be formed from, as a non-limiting example, plastic, metal, glass, quartz and/or a semiconductor material. Furthermore, the carrier 12 may include or be formed from one plastics film or a laminate including one or including a plurality of plastics films. The carrier 12 may be formed as mechanically rigid or mechanically flexible.

An optoelectronic layer structure is formed on the carrier 12. The optoelectronic layer structure includes a first electrode layer 14, which includes a first contact section 16, a second contact section 18 and a first electrode 20. The carrier 12 with the first electrode layer 14 may also be referred to as a substrate. A first barrier layer (not illustrated), as a non-limiting example, a first barrier thin-film layer, may be formed between the carrier 12 and the first electrode layer 14.

The first electrode 20 is electrically insulated from the first contact section 16 by means of an electrical insulation barrier 21. The second contact section 18 is electrically coupled to the first electrode 20 of the optoelectronic layer structure. The first electrode 20 may be formed as an anode or as a cathode. The first electrode 20 may be formed as translucent or transparent. The first electrode 20 includes an electrically conductive material, as a non-limiting example, metal and/or a transparent conductive oxide (TCO) or a layer stack of a plurality of layers including metals or TCOs. The first electrode 20 may include, as a non-limiting example, a layer stack of a combination of a layer of a metal on a layer of a TCO, or vice versa. One non-limiting embodiment is a silver layer applied on an indium tin oxide (ITO) layer (Ag on ITO) or ITO-Ag-ITO multilayers. As an alternative or in addition to the materials mentioned, the first electrode 20 may include: networks composed of metallic nanowires and nanoparticles, as a non-limiting example, composed of Ag, networks composed of carbon nanotubes, graphene particles and graphene layers and/or networks composed of semiconducting nanowires.

An optically functional layer structure, as a non-limiting example, an organic functional layer structure 22, of the optoelectronic layer structure is formed above the first electrode 20. The organic functional layer structure 22 may include, as a non-limiting example, one, two or more partial layers. By way of a non-limiting embodiment, the organic functional layer structure 22 may include a hole injection layer, a hole transport layer, an emitter layer, an electron transport layer and/or an electron injection layer. The hole injection layer serves for reducing the band gap between first electrode and hole transport layer. In the case of the hole transport layer, the hole conductivity is greater than the electron conductivity. The hole transport layer serves for transporting the holes. In the case of the electron transport layer, the electron conductivity is greater than the hole conductivity. The electron transport layer serves for transporting the electrons. The electron injection layer serves for reducing the band gap between second electrode and electron transport layer. Furthermore, the organic functional layer structure 22 may include one, two or more functional layer structure units each including the partial layers mentioned and/or further intermediate layers.

A second electrode 23 of the optoelectronic layer structure is formed above the organic functional layer structure 22, said second electrode being electrically coupled to the first contact section 16. The second electrode 23 may be formed in accordance with one of the configurations of the first electrode 20, wherein the first electrode 20 and the second electrode 23 may be formed identically or differently. The first electrode 20 serves, as a non-limiting example, as an anode or a cathode of the optoelectronic layer structure. The second electrode 23, in a manner corresponding to the first electrode, serves as a cathode or respectively an anode of the optoelectronic layer structure.

The optoelectronic layer structure is an electrically and/or optically active region. The active region is, as a non-limiting example, that region of the optoelectronic component 10 in which electric current for the operation of the optoelectronic component 10 flows and/or in which electromagnetic radiation is generated or absorbed. A getter structure (not illustrated) may be arranged on or above the active region. The getter layer may be formed as translucent, transparent or opaque. The getter layer may include or be formed from a material which absorbs and binds substances that are harmful to the active region.

An encapsulation layer 24 of the optoelectronic layer structure is formed above the second electrode 23 and in part above the first contact section 16 and in part above the second contact section 18, and encapsulates the optoelectronic layer structure. The encapsulation layer 24 may be formed as a second barrier layer, as a non-limiting example, as a second barrier thin-film layer. The encapsulation layer 24 may also be referred to as thin film encapsulation. The encapsulation layer 24 forms a barrier vis-à-vis chemical contaminants and/or atmospheric substances, in particular vis-à-vis water (moisture) and oxygen. The encapsulation layer 24 may be formed as a single layer, a layer stack or a layer structure. The encapsulation layer 24 may include or be formed from: aluminum oxide, zinc oxide, zirconium oxide, titanium oxide, hafnium oxide, tantalum oxide, lanthanum oxide, silicon oxide, silicon nitride, silicon oxynitride, indium tin oxide, indium zinc oxide, aluminum-doped zinc oxide, poly(p-phenylene terephthalamide), Nylon 66, and mixtures and alloys thereof. If appropriate, the first barrier layer may be formed on the carrier 12 in a manner corresponding to a configuration of the encapsulation layer 24.

In the encapsulation layer 24, a first cutout of the encapsulation layer 24 is formed above the first contact section 16 and a second cutout of the encapsulation layer 24 is formed above the second contact section 18. A first contact region 32 is exposed in the first cutout of the encapsulation layer 24 and a second contact region 34 is exposed in the second cutout of the encapsulation layer 24. The first contact region 32 serves for electrically contacting the first contact section 16 and the second contact region 34 serves for electrically contacting the second contact section 18.

An adhesion-medium layer 36 is formed above the encapsulation layer 24. The adhesion-medium layer 36 includes, as a non-limiting example, an adhesion medium, for example an adhesive, for example a lamination adhesive, a lacquer and/or a resin. The adhesion-medium layer 36 may include, as a non-limiting example particles which scatter electromagnetic radiation, for example light scattering particles.

Figure 13:
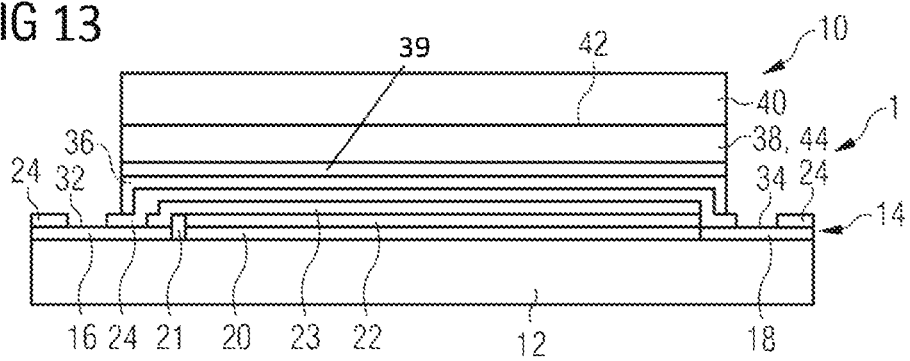
FIG. 13 shows another lateral sectional illustration of the optoelectronic assembly in FIG. 7.

A covering body 38 is formed above the adhesion-medium layer 36. The adhesion-medium layer 36 serves for securing the covering body 38 to the encapsulation layer 24. The covering body 38 includes plastic, glass, as a non-limiting example, a cover glass, and/or metal, as a non-limiting example. By way a non-limiting embodiment, the covering body 38 may substantially be formed from glass and include a thin metal layer, as a non-limiting example, a metal film, and/or a graphite layer, as a non-limiting example, a graphite laminate, on the glass body. The covering body 38 serves for protecting the optoelectronic component 10, as a non-limiting example, against mechanical force influences from outside. Furthermore, the covering body 38 may serve for distributing and/or dissipating heat that is generated in the optoelectronic component 10. As a non-limiting embodiment, the glass of the covering body 38 may serve as protection against external influences and the metal layer of the covering body 38 may serve for distributing and/or dissipating the heat that arises during the operation of the optoelectronic component 10. In other words, the covering body 38 may be formed as a heat sink 39, as shown in FIG. 13. A heat sink 39 may be formed as an alternative or in addition to the covering body 38.

The radiation cooler 40 is arranged on the exterior of the optoelectronic component 10. The radiation cooler 40 is secured directly to the covering body 38 of the optoelectronic component 10. The radiation cooler 40 is formed substantially like the conventional radiation cooler 110 explained with reference to FIG. 2, wherein the covering body 38 of the optoelectronic component 10 may serve as the base body 112 of the radiation cooler 40. In this context, the covering body 38 may be formed by silicon.

A specularly reflective surface 42 is formed between the radiation cooler 40 and the covering body 38. The specularly reflective surface 42 may be formed as part of the radiation cooler 40 or as part of the covering body 38. As a non-limiting embodiment, the specularly reflective surface 42 may be secured by means of an adhesion layer (not illustrated) corresponding, as a non-limiting example, to the adhesion layer 113 on the covering body 38. The adhesion layer may be formed by titanium, if appropriate. The specularly reflective surface 42 may, as a non-limiting example, include silver or aluminum or be formed by silver or aluminum. The specularly reflective surface 42 may correspond to the silver layer 114, as a non-limiting example.

As an alternative thereto, the specularly reflective surface 42 may be formed at a different layer of the optoelectronic component 10 or form a different layer of the optoelectronic component 10. As a non-limiting embodiment, the specularly reflective surface 42 may be formed between the adhesion-medium layer 36 and the covering body 38, between the encapsulation layer 24 and the adhesion-medium layer 36, between the second electrode 23 and the encapsulation layer 24, between the organic functional layer structure 22 and the second electrode 23, between the first electrode 20 and the organic functional layer structure 22, between the carrier 12 and the first electrode 20, or on an underside of the carrier 12, said underside being shown in FIG. 7. As an alternative thereto, the covering body 38 may have a surface that serves as a specularly reflective surface 42, or the second electrode 23 or the first electrode 20 may have a surface that serves as a specularly reflective surface 42, or the carrier 12 may have a surface that serves as a specularly reflective surface 42.

A cooling layer structure of the radiation cooler 40 may correspond, as a non-limiting example, to the cooling layer structure of the conventional radiation cooler 110. In particular, the cooling layer structure of the radiation cooler 40 includes a plurality of layers stacked one above another. The layers are formed alternately by silicon dioxide and hafnium oxide. Layers including titanium dioxide may be formed as an alternative to the layers including hafnium oxide.

The different layers have different refractive indices and different thicknesses. In this case, the cooling layer structure of the radiation cooler 40 includes at least the first thickness region 116, in which the individual layers have thicknesses of between 100 nm and 1000 nm, and the second thickness region 118, in which the individual layers have thicknesses of between 1 and 100 nm. The second thickness region 118 is formed above the mirror layer 114 and the first thickness region 116 is formed above the second thickness region 118.

Figure 8:
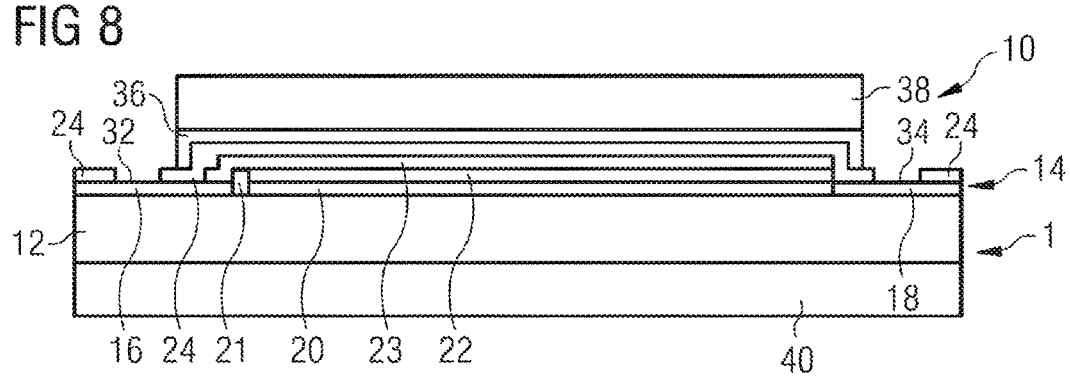
FIG. 8 shows a lateral sectional illustration of one embodiment of an optoelectronic assembly.

FIG. 8 shows one embodiment of an optoelectronic assembly 1 which may, as a non-limiting example, largely correspond to the optoelectronic assembly 1 explained with reference to FIG. 7. In particular, the optoelectronic component 10 may correspond to the optoelectronic component 10 explained with reference to FIG. 7. Alternatively or additionally, the radiation cooler 40 may correspond to the radiation cooler 40 explained with reference to FIG. 7.

The optoelectronic component 10 is preferably formed as a top emitter. As an alternative thereto, however, the optoelectronic component 10 may also be formed as a bottom emitter or as a component that emits on both sides.

The radiation cooler 40 is coupled to the optoelectronic component 10 with direct physical contact. The radiation cooler 40 is arranged on the exterior of the optoelectronic component 10. The radiation cooler 40 is secured to the carrier 12 with direct physical contact.

The specularly reflective surface 42 is formed between the carrier 12 and the radiation cooler 40. As an alternative thereto, the specularly reflective surface 42, as explained with reference to FIG. 7, may be formed at a different layer of the optoelectronic component 10 or form said different layer.

Figure 9:
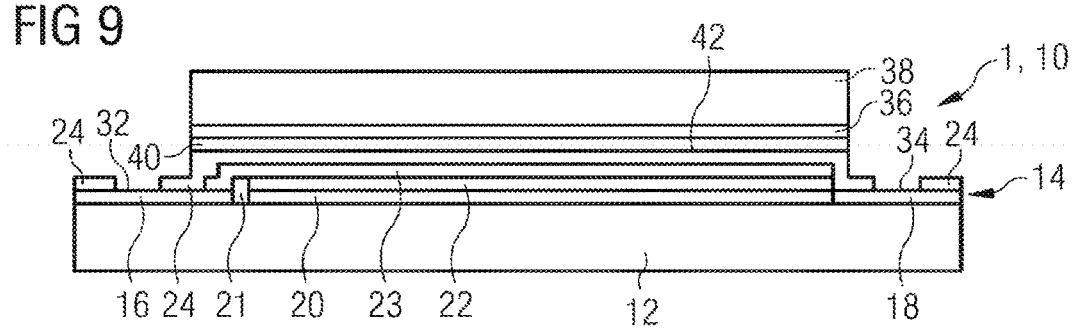
FIG. 9 shows a lateral sectional illustration of one embodiment of an optoelectronic assembly.

FIG. 9 shows one embodiment of an optoelectronic assembly 1 which may, as a non-limiting example, largely correspond to the optoelectronic assembly 1 explained with reference to FIG. 7. In particular, the optoelectronic component 10 may correspond to the optoelectronic component 10 explained with reference to FIG. 7. Alternatively or additionally, the radiation cooler 40 may correspond to the radiation cooler 40 explained with reference to FIG. 7.

The optoelectronic component 10 is preferably formed as a bottom emitter. As an alternative thereto, however, the optoelectronic component 10 may also be formed as a top emitter or as a component that emits on both sides.

The radiation cooler 40 is coupled to the optoelectronic component 10 with direct physical contact. The radiation cooler 40 is integrated into a layer structure of the optoelectronic component 10. The radiation cooler 40 is formed between the encapsulation layer 24 and the adhesion-medium layer 36. As an alternative thereto, the radiation cooler 40 may be formed between the adhesion-medium layer 36 and the covering body 38, between the second electrode 23 and the encapsulation layer 24, or between the carrier 12 and the first electrode 20. Optionally, the adhesion-medium layer 36 and the covering body 38 may be dispensed with, with the result that the radiation cooler 40 serves as a covering for the optoelectronic component 10.

The specularly reflective surface 42 is formed between the encapsulation layer 24 and the radiation cooler 40. As an alternative thereto, the specularly reflective surface 42, as explained with reference to FIG. 7, may be formed at a different layer of the optoelectronic component 10 or form said different layer.

Figure 10:
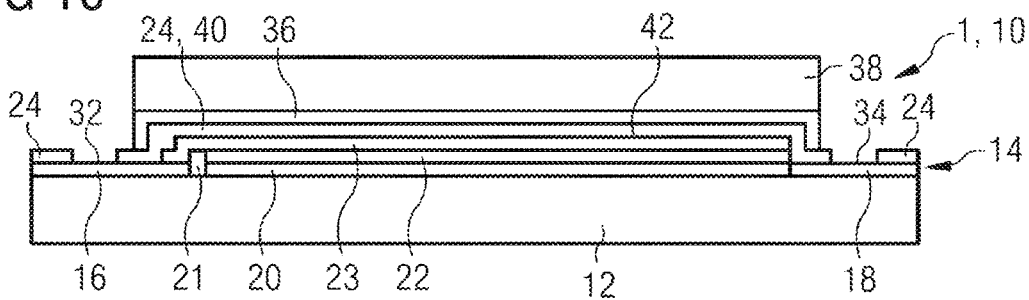
FIG. 10 shows a lateral sectional illustration of one embodiment of an optoelectronic assembly.

FIG. 10 shows one embodiment of an optoelectronic assembly 1 which may, as a non-limiting example, largely correspond to the optoelectronic assembly 1 explained with reference to FIG. 7. In particular, the optoelectronic component 10 may correspond to the optoelectronic component 10 explained with reference to FIG. 7. Alternatively or additionally, the radiation cooler 40 may correspond to the radiation cooler 40 explained with reference to FIG. 7.

The optoelectronic component 10 is preferably formed as a bottom emitter. As an alternative thereto, however, the optoelectronic component 10 may also be formed as a top emitter or as a component that emits on both sides.

The radiation cooler 40 is coupled to the optoelectronic component 10 with direct physical contact. The radiation cooler 40 is integrated into a layer structure of the optoelectronic component 10. The radiation cooler 40 is formed as an encapsulation layer 24 of the optoelectronic component 10. In other words, the radiation cooler 40 forms the encapsulation layer 24. The radiation cooler 40 is in direct physical contact with the second electrode 23. Optionally, the adhesion-medium layer 36 and the covering body 38 may be dispensed with. In this case, the radiation cooler 40 performs the function of cooling, encapsulation and covering of the optoelectronic component 10.

The specularly reflective surface 42 is formed between the second electrode 23 and the radiation cooler 40. As a non-limiting example, the specularly reflective surface 42 may be formed by the second electrode 23. As an alternative thereto, the specularly reflective surface 42, as explained with reference to FIG. 7, may be formed at a different layer of the optoelectronic component 10 or form said different layer.

Figure 11:
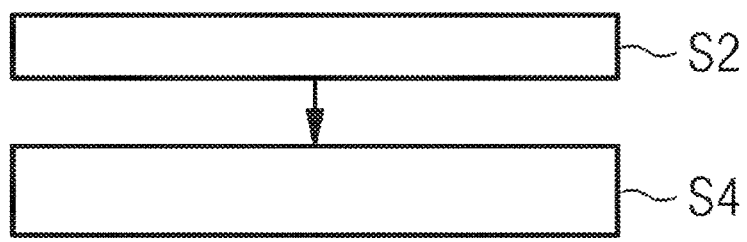
FIG. 11 shows a flow diagram of one embodiment of a method for producing an optoelectronic assembly.

FIG. 11 shows a flow diagram of a method for producing an optoelectronic assembly, as a non-limiting example, the optoelectronic assembly 1 explained above.

In a step S2, an optoelectronic component is formed. As a non-limiting embodiment, the optoelectronic component 10 explained above is formed.

In a step S4, a radiation cooler is coupled to the optoelectronic component. As a non-limiting embodiment, the radiation cooler 40 explained above is coupled to the optoelectronic component 10.

Steps S2 and S4 may be carried out in a manner configured successively, such that firstly the optoelectronic component 10 is formed and then the radiation cooler 40 is coupled to the optoelectronic component. In this case, the radiation cooler 40 may firstly be completed and then be coupled to the optoelectronic component 10. This has the advantage that the process of forming the radiation cooler 40 does not lead to any limitation in the process implementation when forming the optoelectronic component 10. As an alternative thereto, the radiation cooler 40 may be formed directly on the optoelectronic component 10.

As an alternative thereto, steps S2 and S4 may be implemented in the same period of time, as a non-limiting example, if the radiation cooler 40 is integrated in the optoelectronic component 10. As a non-limiting embodiment the radiation cooler 40 may be formed as a layer of the optoelectronic component 10. In this case, the radiation cooler 40 may firstly be completed and be integrated as a finished layer into the optoelectronic component 10, or the radiation cooler 40 may be formed on an already completed layer of the optoelectronic component 10.

The layers of the radiation cooler 40, as a non-limiting example, in the case of thin layers, in particular in the second thickness region 118, may be formed by means of ALD, CVD, sputtering, electron beam or similar methods and, as a non-limiting example, in the case of thick layers, in particular in the first thickness region 116, may be formed by means of CVD, sputtering, electron beam or similar methods.

Figure 12:
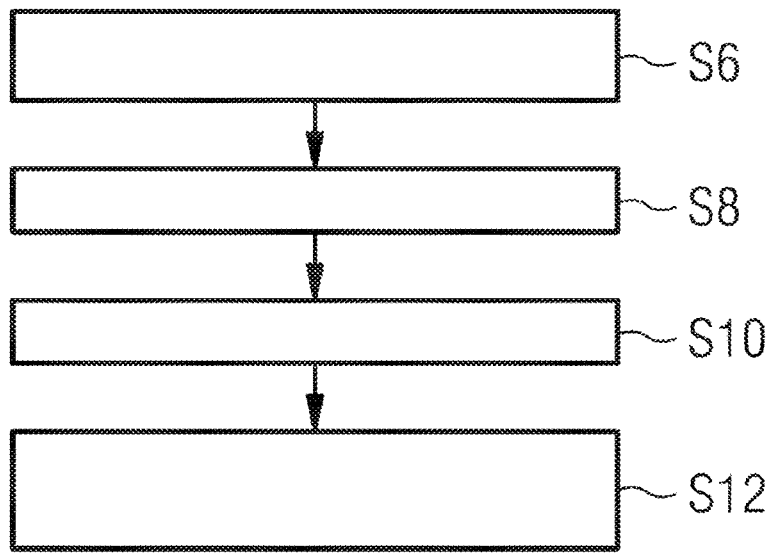
FIG. 12 shows a flow diagram of one embodiment of a method for producing an optoelectronic assembly.

FIG. 12 shows a flow diagram of a method for producing an optoelectronic assembly, as a non-limiting example, the optoelectronic assembly 1 explained above.

A step S6 involves providing a carrier, a covering body and/or a heat sink. As a non-limiting embodiment, the carrier 12, the covering body 38 and/or the heat sink 39 explained above are/is provided. The fact that the carrier 12, the covering body 38 and/or the heat sink 39 are/is provided may mean, as a non-limiting example, that the carrier 12, the covering body 38 and/or the heat sink 39 are/is formed.

In a step S8, the radiation cooler is arranged or formed on the carrier, the covering body and/or the heat sink. By way of a non-limiting embodiment, the radiation cooler 40 is arranged or formed on the carrier 12, the covering body 38 and/or the heat sink 39. In particular, the layers of the radiation cooler 40 may be formed, as a non-limiting example, deposited, on the carrier 12, the covering body 38 and/or the heat sink 39.

In a step S10, which may be carried out, as a non-limiting example, before or after steps S6 and S8, the rest of the optoelectronic component 10 is formed. By way of a non-limiting embodiment, the organic functional layer structure 22 of the optoelectronic component 10, the electrodes 20, 23 and/or the encapsulation layer structure 24 are formed.

In a step S12, the carrier, the covering body or the heat sink coupled to the radiation cooler is arranged on the rest of the optoelectronic component. By way of a non-limiting embodiment, the carrier 12, the covering body 38 or the heat sink 39 respectively having the radiation cooler 40 is arranged in direct physical contact on the rest of the optoelectronic component 10.

Forming or arranging the radiation cooler 40 independently of the rest of the optoelectronic component 10, in particular independently of the organic functional layer structure 22 of the optoelectronic component 10, has the effect that the temperature sensitivity of the organic functional layer structure 22 need not be taken into account when forming or arranging the radiation cooler 40. This is advantageous in particular if the layers of the radiation cooler 40 are formed by means of methods in which basically high temperatures, in particular above 100° C., are used and/or are advantageous.

The invention is not restricted to the embodiments indicated. By way of a non-limiting embodiment, the optoelectronic assembly 1 may include a plurality of optoelectronic components 10 and/or a plurality of radiation coolers 40. Alternatively or additionally, the optoelectronic component 10 may be segmented. Furthermore, in the case of the optoelectronic assemblies 1 explained with reference to FIGS. 7 to 10 and 13, a heat sink 39 may be arranged as an alternative or in addition to one of the layers and/or bodies illustrated. If appropriate, the heat sink 39 is preferably in direct physical contact with the radiation cooler 40.

While the invention has been particularly shown and described with reference to specific embodiments, it should be understood by those skilled in the art that various changed in form and detail may be made therein without departing from the spirit and scope of the invention as defined by the appended claims. The scope of the invention is thus indicated by the appended claims and all changes which come within the meaning and range of equivalency of the claims are therefore intended to be embraced.

LIST OF REFERENCE SIGNS

Optoelectronic assembly 1
Optoelectronic component 10
Carrier 12
First electrode layer 14
First contact section 16
Second contact section 18
First electrode 20
Organic functional layer structure 22
Second electrode 23
Encapsulation layer structure 24
First contact region 32
Second contact region 34
Adhesion-medium layer 36
Covering body 38
Heat sink 39
Radiation cooler 40
Specularly reflective surface 42
Emission spectrum of sun 80
Absorption spectrum of radiation cooler 82
Atmospheric transmissivity 84
Emission spectrum of radiation cooler 86
Solar energy 90
Ambient temperature 92
Temperature of radiation cooler 94
Temperature of black color 96
Temperature of aluminum body 98
Building cooler 100
Frame 102
Membrane 104
Trough 106
Plastics body 108
Conventional radiation cooler 110
Base body 112
Adhesion layer 113
Mirror layer 114
First thickness region 116
Second thickness region 118
Emission/absorption EM/AB
Wavelength LAM
Temperature T
Solar energy SI
Time of day TIME

The invention claimed is:

1. An optoelectronic assembly comprising:
   an optoelectronic component comprising:
      a first electrode;
      an organic functional layer structure arranged above the first electrode;
      a second electrode arranged above the organic functional layer structure;
      and a specularly reflective surface, wherein the second electrode includes or forms the specularly reflective surface; and
   a radiation cooler in physical contact with the optoelectronic component.

2. The optoelectronic assembly as claimed in claim 1, wherein the radiation cooler is arranged on an exterior of the optoelectronic component.

3. The optoelectronic assembly as claimed in claim 2, wherein the optoelectronic component comprises a covering body, which closes off the optoelectronic component toward the outside, and the radiation cooler is arranged on the covering body, and/or
   the optoelectronic component comprises a carrier, which closes off the optoelectronic component toward the outside, and the radiation cooler is arranged on the carrier, and/or
   the optoelectronic component comprises a heat sink, which closes off the optoelectronic component toward the outside, and the radiation cooler is arranged on the heat sink.

4. The optoelectronic assembly as claimed in claim 1, wherein the radiation cooler is integrated into a layer structure of the optoelectronic component.

5. The optoelectronic assembly as claimed in claim 1, wherein the radiation cooler is in direct physical contact with an electrode of the optoelectronic component.

6. The optoelectronic assembly as claimed in claim 1, wherein the optoelectronic component is an organic optoelectronic component implemented as a solar cell or an OLED.

7. The optoelectronic assembly as claimed in claim 1, wherein the radiation cooler comprises a layer structure comprising a plurality of different layers, wherein the layers have different refractive indices and at least partly different layer thicknesses, wherein in a first thickness region of the layer structure layers are formed which have thicknesses which are greater than the thicknesses of layers in a second thickness region.

8. The optoelectronic assembly as claimed in claim 7, wherein the thicknesses in the first thickness region are in a range from 100 to 1000 nm and/or wherein the thicknesses in the second thickness region are in a range from 1 to 100 nm.

9. The optoelectronic assembly as claimed in claim 7, wherein the layers in part comprise or are formed by silicon dioxide and in part comprise or are formed by hafnium oxide or titanium dioxide.

10. An optoelectronic assembly comprising:
    an optoelectronic component comprising:
        a first electrode;
        an organic functional layer structure arranged above the first electrode; and
        a second electrode arranged above the organic functional layer structure; and
    a radiation cooler in contact with the optoelectronic component, wherein the radiation cooler is arranged on a side of the organic functional layer structure opposite of the second electrode, and
        wherein the second electrode is reflective and configured in such a way that radiation leaves the optoelectronic component exclusively through the radiation cooler.

11. The optoelectronic assembly as claimed in claim 10, wherein the radiation cooler is formed as an encapsulation of the optoelectronic component.

12. The optoelectronic assembly as claimed in claim 10, wherein the optoelectronic component is an organic optoelectronic component implemented as a solar cell or an OLED.

13. The optoelectronic assembly as claimed in claim 10, wherein the radiation cooler is arranged on the side of the organic functional layer structure facing away from the second electrode.

14. The optoelectronic assembly as claimed in claim 10, wherein the first electrode is formed as translucent or transparent.

15. An optoelectronic assembly comprising:
    an optoelectronic component comprising:
        a first electrode;
        an organic functional layer structure arranged above the first electrode;
        a second electrode arranged above the organic functional layer structure; and
        a reflective surface; and
    a radiation cooler in contact with the optoelectronic component,
        wherein the radiation cooler comprises a layer structure comprising a plurality of different layers, wherein the layers have different refractive indices and at least partly different layer thicknesses, wherein in a first thickness region of the layer structure layers are formed which have thicknesses which are greater than the thicknesses of layers in a second thickness region.

16. The optoelectronic assembly as claimed in claim 15, wherein the optoelectronic component is an organic optoelectronic component implemented as a solar cell or an OLED.

17. The optoelectronic assembly as claimed in claim 15, wherein the radiation cooler is arranged on a side of the organic functional layer structure facing away from the reflective surface.

18. The optoelectronic assembly as claimed in claim 15, wherein the radiation cooler is arranged on a side of the organic functional layer structure facing towards the reflective surface.

19. The optoelectronic assembly as claimed in claim 15, wherein the optoelectronic component comprises a covering body, and/or
    the optoelectronic component comprises a carrier, and/or
    the optoelectronic component comprises a heat sink.

20. The optoelectronic assembly as claimed in claim 19, wherein the covering body, the carrier, the heat sink, the first electrode and/or the second electrode comprises or forms the reflective surface.

* * * * *